(12) United States Patent
Schierling et al.

(10) Patent No.: US 8,743,572 B2
(45) Date of Patent: Jun. 3, 2014

(54) LOSSY TRIPHASE LOW-PASS FILTER

(75) Inventors: Hubert Schierling, Erlangen (DE);
Benno Weis, Hemhofen (DE)

(73) Assignee: Siemens Aktiengesellschaft, München (DE)

( * ) Notice: Subject to any disclaimer, the term of this patent is extended or adjusted under 35 U.S.C. 154(b) by 635 days.

(21) Appl. No.: 12/996,423

(22) PCT Filed: Apr. 1, 2009

(86) PCT No.: PCT/EP2009/053849
§ 371 (c)(1),
(2), (4) Date: Mar. 7, 2011

(87) PCT Pub. No.: WO2009/146961
PCT Pub. Date: Dec. 10, 2009

(65) Prior Publication Data
US 2011/0187480 A1    Aug. 4, 2011

(30) Foreign Application Priority Data
Jun. 5, 2008    (DE) .......................... 10 2008 026 869

(51) Int. Cl.
*H02M 1/12*    (2006.01)
(52) U.S. Cl.
CPC .................................... *H02M 1/126* (2013.01)
USPC ............................................ 363/47; 333/181
(58) Field of Classification Search
CPC ....................................................... H02M 1/126
USPC ........... 333/81 A, 81 R, 181; 363/39–48, 147
See application file for complete search history.

(56) References Cited

U.S. PATENT DOCUMENTS

| 4,271,446 A | 6/1981 | Comstock |
| 4,730,243 A * | 3/1988 | Glennon .......................... 363/44 |
| 5,705,902 A * | 1/1998 | Merritt et al. ............ 318/400.42 |

FOREIGN PATENT DOCUMENTS

| CN | 15 95 756 A | 3/2005 |
| DE | 3325612 C2 | 1/1990 |
| DE | 10020137 A1 | 10/2001 |
| DE | 102004004627 A1 | 8/2005 |
| DE | 102005019215 A1 | 11/2006 |
| DE | 102005031372 A1 | 1/2007 |
| DE | 102005045552 B4 | 4/2008 |
| EP | 0131815 A1 | 1/1985 |
| EP | 0682402 B1 | 1/1998 |
| EP | 0682401 B1 | 5/1998 |

OTHER PUBLICATIONS

Microwave Journal, Horizon House Publications, Norwood, MA, US, Bd. 35, Nr. 5, May 1, 1992, pp. 280,282-284; Others; 1992.

(Continued)

*Primary Examiner* — Benny Lee
*Assistant Examiner* — Rakesh Patel
(74) *Attorney, Agent, or Firm* — Henry M Feiereisen LLC

(57) ABSTRACT

The invention relates to a lossy triphase low-pass filter having a filter choke, a filter capacitor, and an attenuation element per phase of said the low-pass filter, wherein one filter capacitor and one attenuation element each are electrically connected in series. Two diodes are provided as attenuation elements, which are electrically connected to each other in an anti-parallel manner. In this manner a lossy triphase low-pass filter is obtained, the power loss of which is significantly reduced without any loss of the attenuation effect.

9 Claims, 3 Drawing Sheets

(56) References Cited

OTHER PUBLICATIONS

Hewlett-Packard Journal, Hewlett-Packard Co., Palo Alto, US, Bd. 38, Nr. 7, Jul. 1, 1987, pp. 30-36; Others; 1987.

H. Akagi EPE'95 Sevilla, New Trends in Active Filters, pp. 17-26; Others; 1995.

M.L.Heldwein, T.Nussbaumer, F.Beck, J.W.Kolar Applied Power Electronics Conference and Annual IEEE Austin, TX, USA Mar. 6-10, 2005, p. 797-802; Magazine; 2005.

* cited by examiner

LOSSY TRIPHASE LOW-PASS FILTER

CROSS-REFERENCES TO RELATED APPLICATIONS

This application is the U.S. National Stage of International Application No. PCT/EP2009/053849, filed Apr. 1, 2009, which designated the United States and has been published as International Publication No. WO 2009/146961 and which claims the priority of German Patent Application, Serial No. 10 2008 026 869.0, filed Jun. 5, 2008, pursuant to 35 U.S.C. 119(a)-(d).

BACKGROUND OF THE INVENTION

The invention relates to a lossy triphase low-pass filter.

Commercially available voltage intermediate-circuit converters which are also referred to as frequency converters very often have a so-called output sinusoidal filter on the load side. This output sinusoidal filter is intended to be used to filter out the high-frequency components of each pulsed output voltage of this frequency converter in such a manner that only a fundamental voltage remains at a load, in particular an electric motor, connected to the load-side connections of the frequency converter. Such a sinusoidal filter usually consists of a filter inductor and a filter capacitor which are connected as an LC low-pass filter. These filter elements are tuned in such a manner that a cut-off frequency of this sinusoidal filter is between a maximum fundamental frequency and a switching frequency of the frequency converter.

LC low-pass filters have a resonant frequency. If such a filter is excited in the vicinity of this resonant frequency, this excitation is amplified very quickly. This excitation may be effected by mains harmonics or harmonics of a frequency converter connected to the mains.

On account of this problem, a low-pass filter is designed in such a manner that no excitation is effected in the vicinity of the resonant frequency. Since excitation cannot be entirely excluded, attenuation resistors which keep a resonant peak which arises within tolerable limits are provided as attenuation elements. However, an increased power loss must be expected with these attenuated low-pass filters.

These LC low-pass filters, in particular lossy low-pass filters, are used as mains filters or as output sinusoidal filters in frequency converters. Low-pass filters which have the problem described can be recognized by the fact that the root-mean-square value of a capacitor current in said filters becomes greater in the event of excitation at resonance than during normal operation.

FIG. 1 illustrates a load-side power converter 2, in particular an inverter, of a frequency converter (not illustrated in full) having an output sinusoidal filter 4 (FIG. 1 of EP 0 682 401 B1). In addition to the load-side power converter 2, an intermediate circuit 6 of the frequency converter is illustrated, said intermediate circuit having two capacitors 8 and 10 which are electrically connected in series. The junction point of these two capacitors 8 and 10 forms a so-called neutral point NP. The inputs of the output sinusoidal filter 4 are connected to the output-side connections 12, 14 and 16 of the frequency converter which are the AC-voltage-side connections of the load-side power converter 2. A lossy LC low-pass filter is provided as the output sinusoidal filter 4. This lossy triphase low-pass filter 4 has a filter inductor 18 and a filter capacitor 20 for each phase. These filter capacitors 20 are electrically star-connected. A junction point between a filter inductor 18 and a filter capacitor 20 respectively forms an output terminal 22, 24 and 26 of the output sinusoidal filter 4. A triphase load 28, in particular an electric motor, is connected to these output terminals 22, 24 and 26.

FIG. 2 illustrates a block diagram of a lossy triphase low-pass filter 30 of the generic type. This low-pass filter 30 is known from EP 0 682 402 B2, in particular from FIG. 1 of said patent specification. This lossy triphase low-pass filter 30 differs from the low-pass filter 4 according to FIG. 1 in that an attenuation element 32 is respectively electrically connected in series with a filter capacitor 20. A non-reactive resistor is respectively provided as the attenuation element 32. These attenuation elements 32 are used to attenuate the root-mean-square values of the capacitor currents in the event of excitation at resonance. The use of non-reactive resistors as attenuation elements 32 has the disadvantage that attenuation is less effective with little resonant excitation of the low-pass filter 30. With a large amount of excitation, not only the attenuation effect but also the attenuation losses increase quadratically with the capacitor current. These losses become greater, the greater the intended attenuation effect.

SUMMARY OF THE INVENTION

The invention is now based on the object of developing a lossy low-pass filter in such a manner that the losses are reduced without reducing the attenuation effect.

According to one aspect of the invention, the object is achieved by a lossy triphase low-pass filter having a filter inductor, a filter capacitor and an attenuation element for each phase of this low-pass filter, a filter capacitor and an attenuation element being electrically connected in series in each case and these series circuits being electrically star-connected, wherein two diodes which are electrically reverse-connected in parallel with one another are respectively provided as the attenuation element.

According to another aspect of the invention, the object is achieved by a lossy triphase low-pass filter having a filter inductor and a filter capacitor for each phase of this low-pass filter and an attenuation element, a filter capacitor and the attenuation element being electrically connected in series in each case, wherein a six-pulse diode bridge circuit is provided as the attenuation element, and in that DC-voltage-side connections of this diode bridge circuit are connected to one another in an electrically conductive manner by means of a short-circuit current path.

According to the one aspect of the invention, two diodes which, on the one hand, are reverse-connected in parallel and, on the other hand, are arranged in a six-pulse bridge circuit are respectively provided as the attenuation element. In the embodiment of the attenuation element mentioned first, a non-reactive resistor as the attenuation element may be respectively replaced with two diodes reverse-connected in parallel. This solution has the advantage that a considerable voltage drop already occurs across the diodes reverse-connected in parallel even with a small filter current. This considerably attenuates excitation already from the beginning. If excitation increases further, the losses increase only in a linear manner and no longer quadratically, as with the non-reactive resistor as the attenuation element.

In the alternative embodiment, a six-pulse diode bridge circuit whose DC-voltage-side connections are connected to one another in an electrically conductive manner using a short-circuit current path is provided as the attenuation element. This alternative embodiment does not differ from the first embodiment in terms of effect. The alternative embodiment has the advantage that these diodes connected in a six-pulse bridge circuit are commercially available as a six-pack module. The diodes can be cooled in a very effective manner using such a module.

In one advantageous embodiment of the alternative embodiment of the lossy triphase low-pass filter according to the invention, an attenuation element, in particular a non-reactive resistor, is arranged in the DC-voltage-side short-circuit current path of the six-pulse bridge circuit of the diodes. This attenuation element in the DC-voltage-side short-circuit current path increases the attenuation effect of the attenuation element on the basis of the value of the non-reactive resistor.

In another advantageous embodiment of the alternative embodiment of the lossy triphase low-pass filter according to the invention, a load, in particular a fan, is provided as the attenuation element in the DC-voltage-side short-circuit current path of the six-pulse bridge circuit of the diodes as the attenuation element. As a result, the attenuation energy produced is not converted into heat and emitted to the ambient air but rather is used beneficially. If a fan is provided as the load, this fan can be used to cool the lossy triphase low-pass filter and/or to cool power converter valves of a frequency converter, to the outputs of which the lossy low-pass filter is connected.

In another advantageous embodiment of the alternative embodiment of the lossy triphase low-pass filter according to the invention, a switched-mode power supply is provided as the load in the short-circuit current path of the six-pulse bridge circuit of the diodes as the attenuation element, which switched-mode power supply is used to feed the attenuation energy produced back into an intermediate circuit of a frequency converter, to the outputs of which this lossy low-pass filter is connected. The output voltage of the bridge circuit can be controlled to a predetermined value using the switched-mode power supply as the load in the DC-voltage-side short-circuit current path of the six-pulse bridge circuit of the diodes as attenuation elements of the low-pass filter. This makes it possible to set desired attenuation.

In another advantageous embodiment of the alternative embodiment of the lossy triphase low-pass filter according to the invention, a filter, in particular a band-stop filter, is connected upstream of the six-pulse bridge circuit of the diodes as the attenuation element of the low-pass filter. This limits the current in the six-pulse diode bridge circuit to frequency components which are in the range of the resonant frequency of the low-pass filter. This has the advantage that only those frequency components of the capacitor current of the lossy low-pass filter which may rise to resonance are attenuated. This considerably reduces the current load on the diodes of the six-pulse diode bridge circuit, as a result of which diodes with a lower current load can be used. Not only the space requirement but also the price of the attenuation elements therefore decreases.

BRIEF DESCRIPTION OF THE DRAWING

In order to explain the invention further, reference is made to the drawing which schematically illustrates a plurality of embodiments of a lossy triphase low-pass filter according to the invention.

DETAILED DESCRIPTION OF PREFERRED EMBODIMENTS

Figure 1:
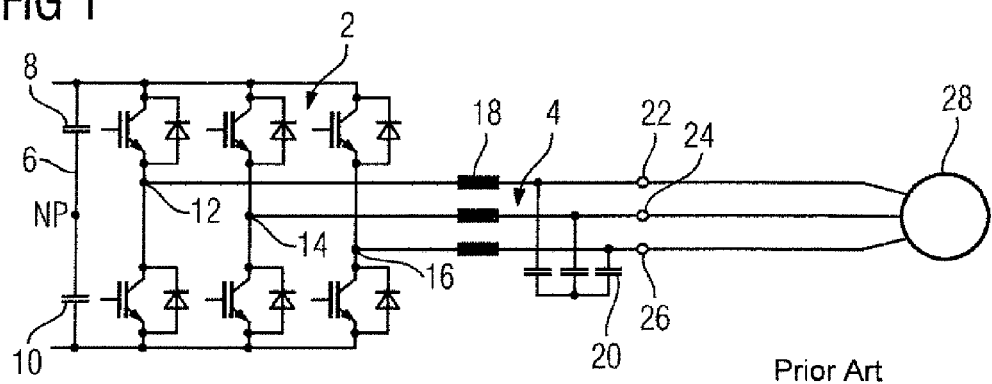
FIG. 1 shows a block diagram of part of a frequency converter having a known output sinusoidal filter.
Figure 2:
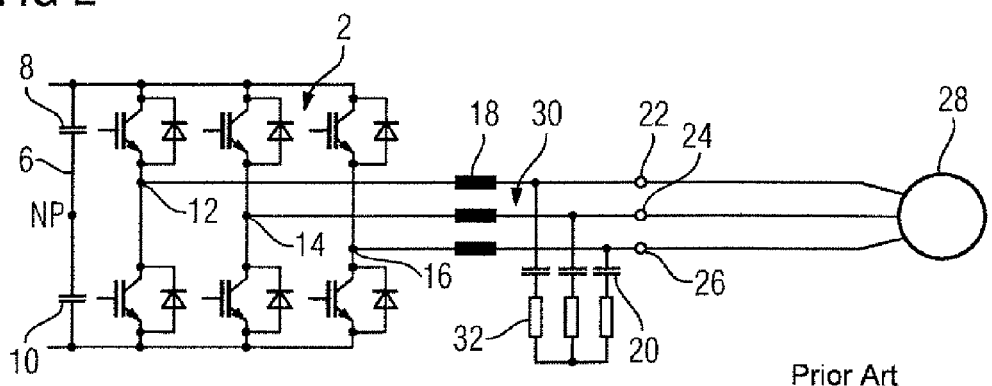
FIG. 2 shows a block diagram of part of a frequency converter having a known lossy output sinusoidal filter.
Figure 3:
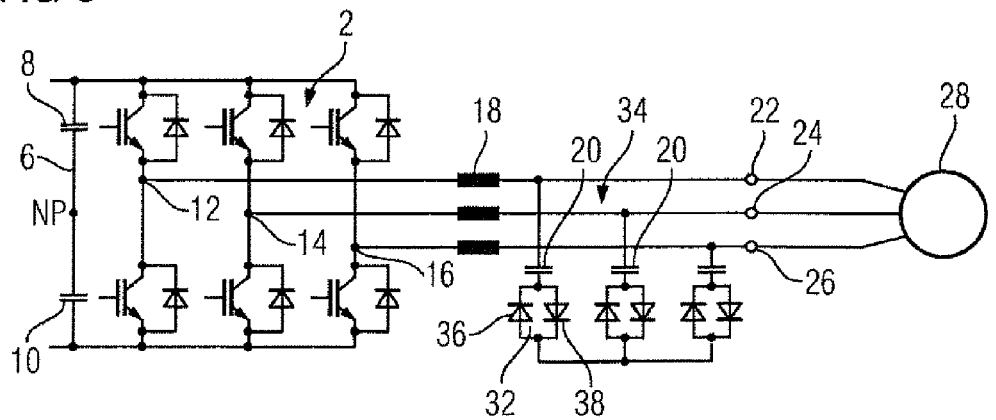
FIG. 3 illustrates a first embodiment of a lossy triphase low-pass filter according to the invention as the output sinusoidal filter of a frequency converter.

FIG. 3 shows a first embodiment of a lossy triphase low-pass filter 34 according to the invention. This lossy triphase low-pass filter 34 is likewise linked, on the input side, to output-side connections 12, 14 and 16 of the load-side power converter 2 of a frequency converter. A triphase load 28 is connected to the output terminals 22, 24 and 26 of this low-pass filter 34. This embodiment of the lossy triphase low-pass filter 34 according to the invention differs from the embodiment of a known lossy triphase low-pass filter 30 according to FIG. 2 in that two diodes 36 and 38 which are reverse-connected in parallel are respectively provided as the attenuation element 32 instead of a non-reactive resistor. As a result of the use of diodes 36 and 38 which are reverse-connected in parallel as attenuation elements 32, considerable attenuation already occurs when a small filter current flows. As in the known embodiment with resistors as attenuation elements 32, attenuation is likewise dependent on the current, the losses increasing in a linear manner with excitation and no longer quadratically, as with the resistor as the attenuation element 32. A lower power loss in the filter 34 also means that the elements of the filter 34 must be cooled to a lesser extent. In addition, this allows a more compact construction of the lossy low-pass filter 34. That is to say such a filter 34 according to the invention can be accommodated in a simpler manner in a frequency converter.

Figure 4:
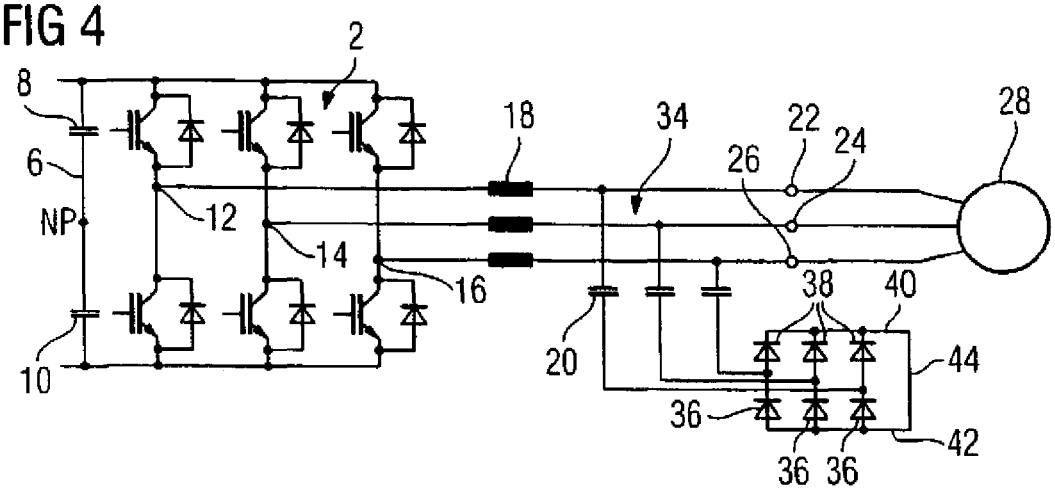
FIG. 4 illustrates an alternative embodiment of the lossy triphase low-pass filter according to the invention, and FIGS. 5 to 8 each show an advantageous embodiment of the alternative embodiment of the low-pass filter according to the invention shown in FIG. 4.

FIG. 4 illustrates an alternative embodiment of a lossy triphase low-pass filter 34 according to the invention. In this alternative embodiment, two diodes 36 and 38 are respectively likewise used as the attenuation element 32 but, in comparison with the embodiment according to FIG. 3, are not arranged back-to-back in parallel with respect to one another. In the alternative embodiment of the lossy triphase low-pass filter 34 according to the invention, these diodes 36 and 38 are electrically connected in series. With a triphase embodiment of the filter 34 according to the invention, three series circuits which are electrically connected in parallel on the DC-voltage side are thus produced. The two connections 40 and 42 of this parallel circuit are connected to one another in an electrically conductive manner using a short-circuit current path 44. This parallel circuit of three series circuits each comprising two diodes 36 and 38 is equivalent to a six-pulse bridge circuit, in particular a six-pulse diode rectifier, whose DC-voltage-side connections 40 and 42 are short-circuited using a DC-voltage line. This alternative embodiment has the same effect as the embodiment of the filter 34 according to the invention shown in FIG. 3. The advantage of this alternative embodiment is that commercially available diode modules in a six-pack design can be used for the attenuation elements 32 of a triphase lossy low-pass filter 34. These modules take up less space than individual diodes. In addition, the diodes in this six-pack module are cooled in a more effective manner and the installation of such a module is likewise simplified.

Figure 5:
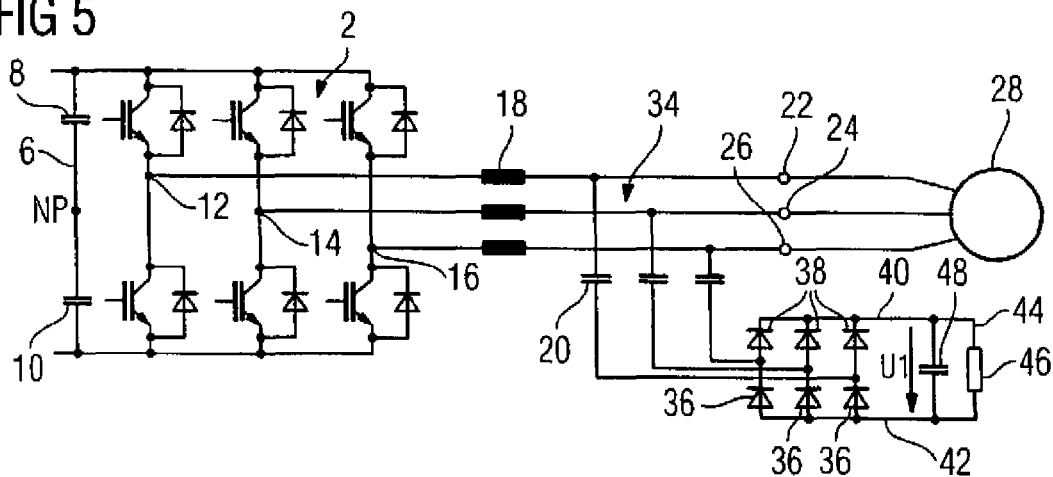

FIG. 5 schematically illustrates one advantageous embodiment of the alternative embodiment of the triphase lossy low-pass filter 34 according to the invention. This advantageous embodiment differs from the embodiment according to FIG. 4 in that an attenuation element is arranged in the short-circuit current path 44 between the two connections 40 and 42 of the six-pulse diode bridge circuit. In this embodiment, a non-reactive resistor 46 is provided as the attenuation element, a capacitor 48 being electrically connected in parallel with said resistor. As a result of the use of a resistor 46 as the attenuation element in the short-circuit current path 44 of the six-pulse diode bridge circuit, the attenuating effect of the attenuation elements 32 of the lossy triphase low-pass filter 34 increases considerably. The capacitor 48 smoothes and likewise limits a voltage U1 at the connections 40 and 42 of the six-pulse diode bridge circuit. The capacitor 48 is also referred to as a smoothing capacitor for these reasons.

In a further advantageous embodiment of the alternative embodiment of the lossy triphase low-pass filter 34 according to the invention shown in FIG. 5, an electrical load 50, in particular a fan, is provided as the attenuation element in the short-circuit current path 44 of the six-pulse diode bridge circuit. As a result, the power loss of the lossy triphase low-pass filter 34 is not converted into heat and emitted to the ambient air but rather is used to drive a fan. That is to say the power loss is used beneficially. In order to dissipate the power loss, a fan which must be supplied with a supply voltage is required in the case of ducted cooling. This supply voltage is provided by the frequency converter or is derived from a supply system. In this further advantageous embodiment, this supply voltage is covered by the power loss of the attenuation elements 32 of the lossy low-pass filter 34.

Figure 6:
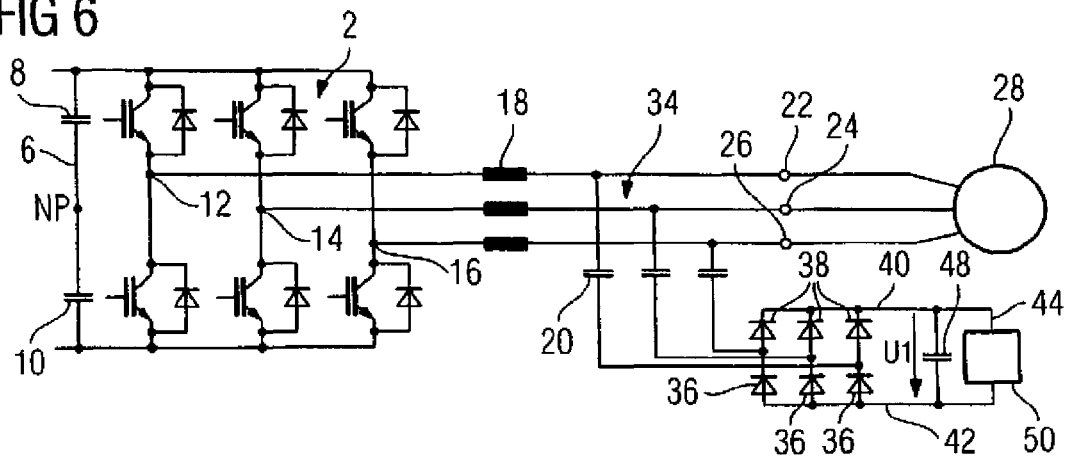
Figure 7:
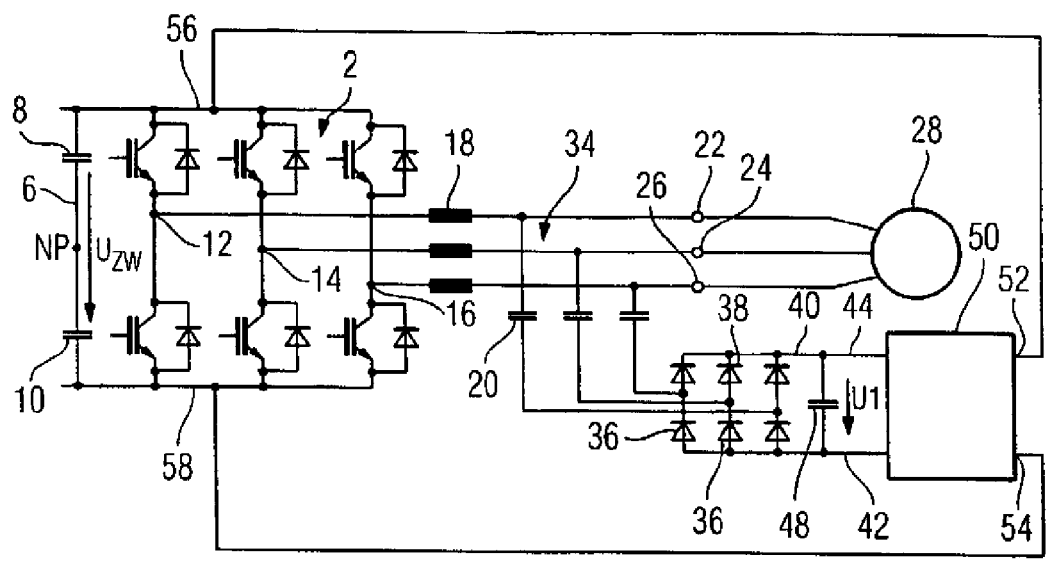

A further advantageous embodiment of the alternative embodiment of the lossy triphase low-pass filter 34 according to the invention shown in FIG. 4 is illustrated in more detail in FIG. 7. This further advantageous embodiment differs from the further advantageous embodiment according to FIG. 6 in that a switched-mode power supply is provided as the electrical load 50 of the attenuation element in the short-circuit current path 44 of the six-pulse diode bridge circuit. Each of the two outputs 52 and 54 of this switched-mode power supply is connected to a DC-voltage-side connection 56 and 58 of the load-side power converter 2 of a frequency converter, to the output-side connections 12, 14 and 16 of which this lossy triphase low-pass filter 34 is connected. As a result of the use of a switched-mode power supply as the electrical load 50 as the attenuation element in the short-circuit current path 44 of the six-pulse diode bridge circuit, the attenuation energy can be fed back into the intermediate circuit 6 of the frequency converter.

In addition, an input voltage U1 dropped across the smoothing capacitor 48 can be controlled. A simple possibility involves defining a predetermined value for this input voltage U1 of the switched-mode power supply. If the exciting currents in the filter capacitors 20 are small and filter excitation is thus low, less attenuation energy is fed back. If the filter currents are large and thus filter excitation is high, a lot of energy is fed back. This further advantageous embodiment of the alternative embodiment of the lossy triphase low-pass filter 34 according to the invention shown in FIG. 4 thus makes it possible to set desired attenuation in a selectable manner.

All known topologies can be used as the switched-mode power supply. Since the voltage difference between the input voltage U1 of the switched-mode power supply and the intermediate circuit voltage $U_{ZW}$ of the frequency converter is generally very large, potential-isolating switched-mode power supplies afford a particular advantage.

Figure 8:
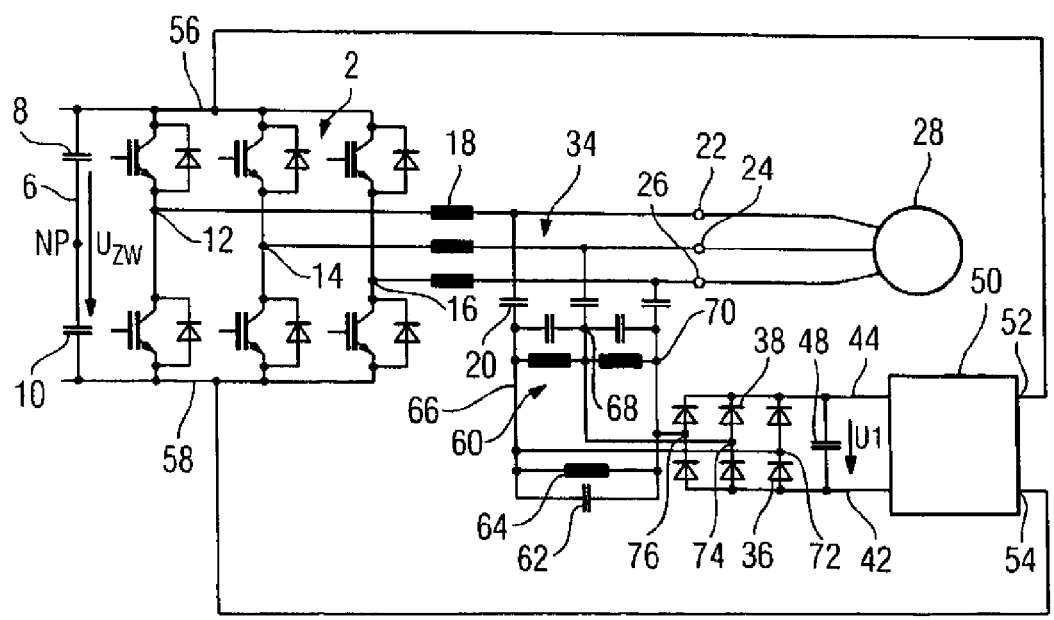

Another advantageous embodiment of the alternative embodiment of the lossy triphase low-pass filter 34 according to the invention shown in FIG. 4 is illustrated in more detail in FIG. 8. This embodiment differs from the embodiment according to FIG. 7 in that a filter 60 is connected upstream of the six-pulse diode bridge circuit. A band-stop filter is provided as the filter 60. This band-stop filter 60 respectively has a filter capacitor 62 and a filter inductor 64 which are electrically connected in parallel. These three parallel circuits are electrically delta-connected. A star connection would also be alternatively possible. The connections 66, 68 and 70 of this band-stop filter 60 are connected in an electrically conductive manner to AC-voltage-side connections 72, 74 and 76 of each series circuit comprising two diodes 36 and 38, a connection of a filter capacitor 20 of the lossy triphase low-pass filter 34 also being respectively connected to said AC-voltage-side connections. This band-stop filter 60 is used to limit the current in the six-pulse diode bridge circuit to the frequency components which are in the range of the resonant frequency of the low-pass filter 34. This has the advantage that only those frequency components of the current which may rise to resonance are attenuated by the filter capacitors 20 of the low-pass filter 34. The current load on each diode 36 and 38 of the six-pulse diode bridge circuit thus falls considerably, which results in diodes with a lower current load or a diode module in a six-pack design with a lower current load being able to be used. Such diodes or such a diode six-pack module is/are more cost-effective and require(s) a smaller amount of effort to dissipate the power loss.

The voltage U1 which is present in the embodiments according to FIGS. 7 and 8 and is dropped across the smoothing capacitor 48 can additionally be used as the input variable for a protective function. If the value of this voltage U1 exceeds a predetermined permissible limit value, it is inferred from this that the currents through the filter capacitors 20 of the lossy triphase low-pass filter 34 are impermissibly high. This exceeding of a limit value is used to generate a protective disconnection of the frequency converter, to the outputs 12, 14 and 16 of which the lossy triphase low-pass filter 34 is connected.

The use of two respective diodes 36 and 38 as the attenuation element 32 of a lossy triphase low-pass filter 34 instead of non-reactive resistors considerably reduces the power loss of this lossy triphase low-pass filter 34 without diminishing the attenuation effect. It is also possible to make the attenuating effect of the attenuation elements 32 of the lossy triphase low-pass filter 34 more effective.

The invention claimed is:

1. A lossy triphase low-pass filter, each phase comprising:
   a filter inductor connected in-line between a triphase AC power source and a triphase AC load, and
   a filter capacitor connected with a first terminal to the corresponding phase,
   a six-pulse diode bridge circuit having triphase input AC terminals and DC output terminals, with each input AC terminal connected to a second terminal of the filter capacitor in each phase in one-to-one correspondence, and with the DC output terminals terminated by means of a 2-terminal DC current-conducting attenuation element constructed as a DC electrical load.

2. The lossy triphase low-pass filter of claim 1, further comprising a capacitor connected in parallel with the DC-current conducting attenuation element.

3. The lossy triphase low-pass filter of claim 1, wherein the DC electrical load is a fan.

4. The lossy triphase low-pass filter of claim 1, wherein the DC electrical load has a DC output side which is connected to a DC input side of a DC/AC inverter having a triphase AC output side forming the triphase AC power source.

5. The lossy triphase low-pass filter of claim 4, wherein the DC electrical load is a switched-mode DC/DC power supply.

6. A lossy triphase low-pass filter, each phase comprising:
a filter inductor connected in-line between a triphase AC power source and a triphase AC load, and
a filter capacitor connected with a first terminal to the corresponding phase,
a six-pulse diode bridge circuit having triphase AC terminals and DC terminals, with each triphase AC terminal connected to a second terminal of the filter capacitor in each phase in one-to-one correspondence, and with the DC terminals connected to each other by a short-circuit DC current path.

7. A lossy triphase low-pass filter, each phase comprising:
a filter inductor connected in-line between a triphase AC power source and a triphase AC load, and
a filter capacitor connected with a first terminal to the corresponding phase,
a six-pulse diode bridge circuit having triphase input AC terminals and DC output terminals, with each AC terminal connected to a second terminal of the filter capacitor in each phase in one-to-one correspondence, and with the DC output terminals terminated by means of a 2-terminal DC current-conducting attenuation element, and
a band-stop filter connected upstream of the six-pulse diode bridge circuit.

8. A lossy triphase low-pass filter, each phase comprising:
a filter inductor connected in-line between a triphase AC power source and a triphase AC load, and
a filter capacitor connected with a first terminal to the corresponding phase;
a six-pulse diode bridge circuit having triphase input AC terminals and DC output terminals, with each input AC terminal connected to a second terminal of the filter capacitor in each phase in one-to-one correspondence, and with the DC output terminals terminated by means of a 2-terminal DC current-conducting attenuation element, and
a filter connected upstream of the six-pulse diode bridge circuit, wherein the filter comprises a parallel connection of a capacitor and an inductor connected between each of two AC terminals of the six-pulse diode bridge circuit.

9. A lossy triphase low-pass filter, each phase comprising:
a filter inductor connected in-line between a triphase AC power source and a triphase AC load, and
a filter capacitor connected with a first terminal to the corresponding phase;
a six-pulse diode bridge circuit having triphase input AC terminals and DC output terminals, with each input AC terminal connected to a second terminal of the filter capacitor in each phase in one-to-one correspondence, and with the DC output terminals terminated by means of a 2-terminal DC current-conducting attenuation element, and
a filter connected upstream of the six-pulse diode bridge circuit, wherein the filter comprises for each phase a capacitor and an inductor connected in parallel, with each parallel connection connected to corresponding input AC terminals of the six-pulse diode bridge circuit in a Delta configuration.

* * * * *

UNITED STATES PATENT AND TRADEMARK OFFICE
CERTIFICATE OF CORRECTION

| | | |
|---|---|---|
| PATENT NO. | : 8,743,572 B2 | Page 1 of 1 |
| APPLICATION NO. | : 12/996423 | |
| DATED | : June 3, 2014 | |
| INVENTOR(S) | : Schierling et al. | |

It is certified that error appears in the above-identified patent and that said Letters Patent is hereby corrected as shown below:

On the title page item [56], line 3 delete, "said".

In the Specification

Col. 8 line 9 change "each of the two AC terminals" to "each input AC terminals".

Signed and Sealed this
Sixth Day of January, 2015

Michelle K. Lee
*Deputy Director of the United States Patent and Trademark Office*